US011476081B2

(12) United States Patent
Kris et al.

(10) Patent No.: US 11,476,081 B2
(45) Date of Patent: Oct. 18, 2022

(54) EVALUATING AN INTERMEDIATE PRODUCT RELATED TO A THREE-DIMENSIONAL NAND MEMORY UNIT

(71) Applicant: APPLIED MATERIALS ISRAEL LTD., Rehovot (IL)

(72) Inventors: Roman Kris, Jerusalem (IL); Vadim Vereschagin, Hod-HaSharon (IL); Assaf Shamir, Tel-Aviv (IL); Elad Sommer, Nes-Harim (IL); Sharon Duvdevani-Bar, Mazkeret-Batya (IL); Meng Li Cecilia Lim, Singapore (SG)

(73) Assignee: APPLIED MATERIALS ISRAEL LTD., Rehovot (IL)

( * ) Notice: Subject to any disclaimer, the term of this patent is extended or adjusted under 35 U.S.C. 154(b) by 310 days.

(21) Appl. No.: 16/917,304

(22) Filed: Jun. 30, 2020

(65) Prior Publication Data

US 2021/0066026 A1 Mar. 4, 2021

Related U.S. Application Data

(60) Provisional application No. 62/895,917, filed on Sep. 4, 2019.

(51) Int. Cl.
*H01L 27/11519* (2017.01)
*H01L 27/11551* (2017.01)
(Continued)

(52) U.S. Cl.
CPC ............ *H01J 37/222* (2013.01); *H01J 37/28* (2013.01); *H01L 22/12* (2013.01);
(Continued)

(58) Field of Classification Search
CPC .. H01J 37/222; H01J 37/28; H01J 2237/2815; H01J 2237/2814; H01L 22/12;
(Continued)

(56) References Cited

U.S. PATENT DOCUMENTS

| 8,873,067 B2 * | 10/2014 | Lee .................. G01B 11/24 356/504 |
| 2006/0187446 A1 * | 8/2006 | Chang ............... G01N 21/9501 356/237.5 |

(Continued)

*Primary Examiner* — Duy T Nguyen
(74) *Attorney, Agent, or Firm* — Kilpatrick Townsend & Stockton LLP (57) ABSTRACT

A method, non-transitory computer readable medium and an evaluation system for evaluating an intermediate product related to a three dimensional NAND memory unit. The evaluation system may include an imager and a processing circuit. The imager may be configured to obtain, via an open gap, an electron image of a portion of a structural element that belongs to an intermediate product. The structural element may include a sequence of layers that include a top layer that is followed by alternating nonconductive layers and recessed conductive layers. The imager may include electron optics configured to scan the portion of the structural element with an electron beam that is oblique to a longitudinal axis of the open gap. The processing circuit is configured to evaluate the intermediate product based on the electron image. The open gap (a) exhibits a high aspect ratio, (b) has a width of nanometric scale, and (c) is formed between structural elements of the intermediate product.

15 Claims, 10 Drawing Sheets (51) Int. Cl.
    *H01L 27/11524*     (2017.01)
    *H01L 21/66*     (2006.01)
    *H01J 37/22*     (2006.01)
    *H01J 37/28*     (2006.01)

(52) U.S. Cl.
    CPC .. *H01L 27/11519* (2013.01); *H01L 27/11524* (2013.01); *H01L 27/11551* (2013.01); *H01J 2237/2815* (2013.01)

(58) Field of Classification Search
    CPC ......... H01L 27/11519; H01L 27/11524; H01L 27/11551; H01L 27/11556; H01L 27/11582; G01N 21/8851; G01N 21/9501; G01N 21/9515; G01N 2021/8887
    USPC .......................................................... 438/16
    See application file for complete search history.

(56) References Cited

U.S. PATENT DOCUMENTS

| | | | | |
|---|---|---|---|---|
| 2013/0148877 A1* | 6/2013 | Claypool | ................ | H01L 22/12 |
| | | | | 382/145 |
| 2013/0202188 A1* | 8/2013 | Urano | .................... | G06T 7/001 |
| | | | | 382/145 |
| 2015/0362524 A1* | 12/2015 | Chirko | ................... | G01Q 30/02 |
| | | | | 850/36 |
| 2018/0340894 A1* | 11/2018 | Rim | ........................ | H01L 22/12 |

\* cited by examiner

```
┌─────────────────────────────────────────────────────────────────────────────┐
│ Obtaining, via an open gap, an electron image of a portion of a structural  │
│ element that belongs to the intermediate product. The structural may        │
│ include a sequence of layers. The sequence of layers may include a top      │
│ layer that is followed by alternating nonconductive layers and recessed     │
│ conductive layers. The open gap (a) has a longitudinal axis, (b) exhibits   │
│ a high aspect ratio, (c) has a width of nanometric scale, and (d) is        │
│ formed between structural elements of the intermediate product. The         │
│ intermediate product is manufactured by one or more manufacturing stages    │
│ of a manufacturing process of a three dimensional NAND memory unit. 210     │
│ ┌─────────────────────────────────────────────────────────────────────────┐ │
│ │ Scanning the portion of the structural element with an electron beam    │ │
│ │ that is oblique to a longitudinal axis of the open gap 212              │ │
│ └─────────────────────────────────────────────────────────────────────────┘ │
└─────────────────────────────────────────────────────────────────────────────┘
                                      │
                                      ▼
┌─────────────────────────────────────────────────────────────────────────────┐
│           Evaluating the intermediate product based on the electron image. 220 │
│ ┌─────────────────────────────────────────────────────────────────────────┐ │
│ │ Estimating a depth of at least one recess formed within one or more     │ │
│ │ recessed conductive layers of the recessed conductive layers. 221       │ │
│ ├─────────────────────────────────────────────────────────────────────────┤ │
│ │ Estimating a depth of a recess formed within a highest recessed         │ │
│ │ conductive layer of the recessed conductive layers. 222                 │ │
│ ├─────────────────────────────────────────────────────────────────────────┤ │
│ │ Calculating a relationship between (a) an intensity attribute of top    │ │
│ │ layer pixels of the electron image, and (b) an intensity attribute of   │ │
│ │ pixels of the electron image that are related to at least one layer of  │ │
│ │ the sequence of alternating layers. The relationship is indicative of   │ │
│ │ the depth of the top recess. 223                                        │ │
│ ├─────────────────────────────────────────────────────────────────────────┤ │
│ │ Calculating a relationship between (a) an intensity attribute of top    │ │
│ │ layer pixels of the electron image, and (b) an intensity attribute of   │ │
│ │ pixels of the electron image that are related to a highest recessed     │ │
│ │ conductive layer. The relationship is indicative of the depth of the    │ │
│ │ top recess. 224                                                         │ │
│ ├─────────────────────────────────────────────────────────────────────────┤ │
│ │ Calculating a relationship between a first highest peak of the electron │ │
│ │ image and a second highest peak of the electron image. The relationship │ │
│ │ is indicative of the depth of the top recess. 225                       │ │
│ ├─────────────────────────────────────────────────────────────────────────┤ │
│ │ Determining, based on the relationship, the depth of at least one       │ │
│ │ recess formed within one or more recessed conductive layers of the      │ │
│ │ recessed conductive layers. 226                                         │ │
│ └─────────────────────────────────────────────────────────────────────────┘ │
└─────────────────────────────────────────────────────────────────────────────┘
                                      │
                                      ▼
┌─────────────────────────────────────────────────────────────────────────────┐
│            Responding to the evaluating the intermediate product 230        │
└─────────────────────────────────────────────────────────────────────────────┘

EVALUATING AN INTERMEDIATE PRODUCT RELATED TO A THREE-DIMENSIONAL NAND MEMORY UNIT

CROSS-REFERENCE TO RELATED APPLICATIONS

This application claims priority and claims the benefit of 62/895,917 filed Sep. 4, 2019. The disclosure of which is hereby incorporated by reference in its entirety and for all purposes.

BACKGROUND OF THE INVENTION

A three dimensional NAND memory unit includes a three dimensional array of memory cells. The abbreviation "NAND" stands for a not-and logic operation. The three dimensional NAND memory unit may be manufactured by a manufacturing process that involves multiple manufacturing stages. An outcome of each manufacturing stage (except of a final manufacturing stage of the manufacturing process) may be regarded as an intermediate product that is related to the three dimensional NAND memory unit.

These manufacturing stages should be monitored. Failures introduced in one or more manufacturing stages may dramatically reduce the yield of the entire manufacturing process. The monitoring of the intermediate products and the monitoring of the manufacturing stages is problematic because the structural elements of the intermediate products are spaced apart from each other by gaps that are of nanometric scale and exhibit a high aspect ratio.

There is a growing need to provide an accurate and efficient manner to evaluate an intermediate product manufactured by one or more manufacturing stages of a three dimensional NAND memory unit.

BRIEF SUMMARY OF THE INVENTION

There may be provided an evaluation system that may include an imager; and a processing circuit. The imager may be configured to obtain, via an open gap, an electron image of a portion of a structural element that belongs to an intermediate product. The structural element may include a sequence of layers, wherein the sequence of layers may include a top layer that is followed by alternating nonconductive layers and recessed conductive layers. The images may include electron optics configured to scan the portion of the structural element with an electron beam that is oblique to a longitudinal axis of the open gap. The processing circuit may be configured to evaluate the intermediate product based on the electron image. The open gap (a) exhibits a high aspect ratio, (b) has a width of nanometric scale, and (c) is formed between structural elements of the intermediate product. The intermediate product may be manufactured by one or more manufacturing stages of a manufacturing process of a three dimensional NAND memory unit.

There may be provided a method for evaluating an intermediate product, the method may include (i) obtaining, via an open gap, an electron image of a portion of a structural element that belongs to the intermediate product; wherein the structural element comprises a sequence of layers, wherein the sequence of layers comprises a top layer that is followed by alternating nonconductive layers and recessed conductive layers; and (ii) evaluating the intermediate product based on the electron image. The open gap (a) has a longitudinal axis, (b) exhibits a high aspect ratio, (c) has a width of nanometric scale, and (d) is formed between structural elements of the intermediate product. The intermediate product may be manufactured by one or more manufacturing stages of a manufacturing process of a three dimensional NAND memory unit. The obtaining of the electron image may include scanning the portion of the structural element with an electron beam that is oblique to a longitudinal axis of the open gap.

There may be provided a non-transitory computer readable medium that may store instructions for (i) obtaining, via an open gap, an electron image of a portion of a structural element that belongs to an intermediate product; wherein the structural element comprises a sequence of layers, wherein the sequence of layers comprises a top layer that is followed by alternating nonconductive layers and recessed conductive layers; and (ii) evaluating the intermediate product based on the electron image. The open gap (a) has a longitudinal axis, (b) exhibits a high aspect ratio, (c) has a width of nanometric scale, and (d) is formed between structural elements of the intermediate product. The intermediate product is manufactured by one or more manufacturing stages of a manufacturing process of a three dimensional NAND memory unit. The obtaining of the electron image may include scanning the portion of the structural element with an electron beam that is oblique to a longitudinal axis of the open gap.

BRIEF DESCRIPTION OF THE DRAWINGS

The subject matter regarded as the embodiments of the disclosure is particularly pointed out and distinctly claimed in the concluding portion of the specification. The embodiments of the disclosure, however, both as to organization and method of operation, together with objects, features, and advantages thereof, may best be understood by reference to the following detailed description when read with the accompanying drawings in which:

DETAILED DESCRIPTION OF THE INVENTION

In the following detailed description, numerous specific details are set forth in order to provide a thorough understanding of the embodiments of the disclosure.

However, it will be understood by those skilled in the art that the present embodiments of the disclosure may be practiced without these specific details. In other instances, well-known methods, procedures, and components have not been described in detail so as not to obscure the present embodiments of the disclosure.

The subject matter regarded as the embodiments of the disclosure is particularly pointed out and distinctly claimed in the concluding portion of the specification. The embodiments of the disclosure, however, both as to organization and method of operation, together with objects, features, and advantages thereof, may best be understood by reference to the following detailed description when read with the accompanying drawings.

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

Because the illustrated embodiments of the disclosure may for the most part, be implemented using electronic components and circuits known to those skilled in the art, details will not be explained in any greater extent than that considered necessary as illustrated above, for the understanding and appreciation of the underlying concepts of the present embodiments of the disclosure and in order not to obfuscate or distract from the teachings of the present embodiments of the disclosure Any reference in the specification to a method should be applied mutatis mutandis to a system capable of executing the method and should be applied mutatis mutandis to a computer readable medium that is non-transitory and stores instructions for executing the method.

Any reference in the specification to a system should be applied mutatis mutandis to a method that may be executed by the system and should be applied mutatis mutandis to a computer readable medium that is non-transitory and stores instructions executable by the system.

Any reference in the specification to a computer readable medium that is non-transitory should be applied mutatis mutandis to a method that may be applied when executing instructions stored in the computer readable medium and should be applied mutatis mutandis to a system configured to execute the instructions stored in the computer readable medium.

The term "and/or" means additionally or alternatively.

The term "aspect ratio" means a ratio between a depth and a width of an element. A high aspect ratio may be regarded as an aspect ratio that exceeds, for example 10:1.

The term "nanometric scale" means a value that may range between few tens nanometers and less than one nanometer.

The term "electron image" means an image generated by applying an electron image acquisition process that involves (a) illuminating a one or more intermediate products (or one or more portions of the one or more intermediate products) with one or more electron beams and (b) detecting electrons emitted due to the illuminating.

The electron image acquisition process may also include processing detection signals that represent the detection of the detected electrons.

The processing of the detection signals may include applying at least one out of noise reduction operations, smoothing operations, and/or providing an electron image of a certain format. The certain format may be a gray level format—but other formats may be provided.

The detected electrons may be secondary electrons, backscattered electrons, and the like.

The electron image acquisition process may be executed by a scanning electron microscope (SEM), by a critical dimension SEM, by a defect review SEM, by an electron beam images, and the like.

There may be provided an evaluation system, a method and a non-transitory computer readable medium for evaluating an intermediate product.

The manufacturing process of a three dimensional NAND memory device may include at least some of the following manufacturing stags:
  a. Depositing various layers such as a top layer that is followed by alternating conductive layers and nonconductive layers. The various layers form a substrate.
  b. Forming open gaps. The formation of the open gaps may involve drilling vertical cell holes through the various layers. The depth of the cell holes are at least ten times bigger than the width of the cell holes. Accordingly—the cell holes have a high aspect ratio.
  c. Selectively etching the conductive layers to form recessed conductive layers that include recesses.
  d. Depositing an intermediate material in the recesses.
  e. Depositing a floating gate above the intermediate material.
  f. Etching excess material and leaving isolated floating gates in the recesses.
  g. Depositing an outer layer that defines an empty tunnel.
  h. Filling the empty tunnel.

The method may be executed before manufacturing stage (e) that involves depositing a floating gate above intermediate material deposited in recesses of recessed conductive layers.

The method may be executed after a completion of manufacturing stage (c) that involves selectively etching conductive layers to form recesses in the conductive layers.

Figure 1:
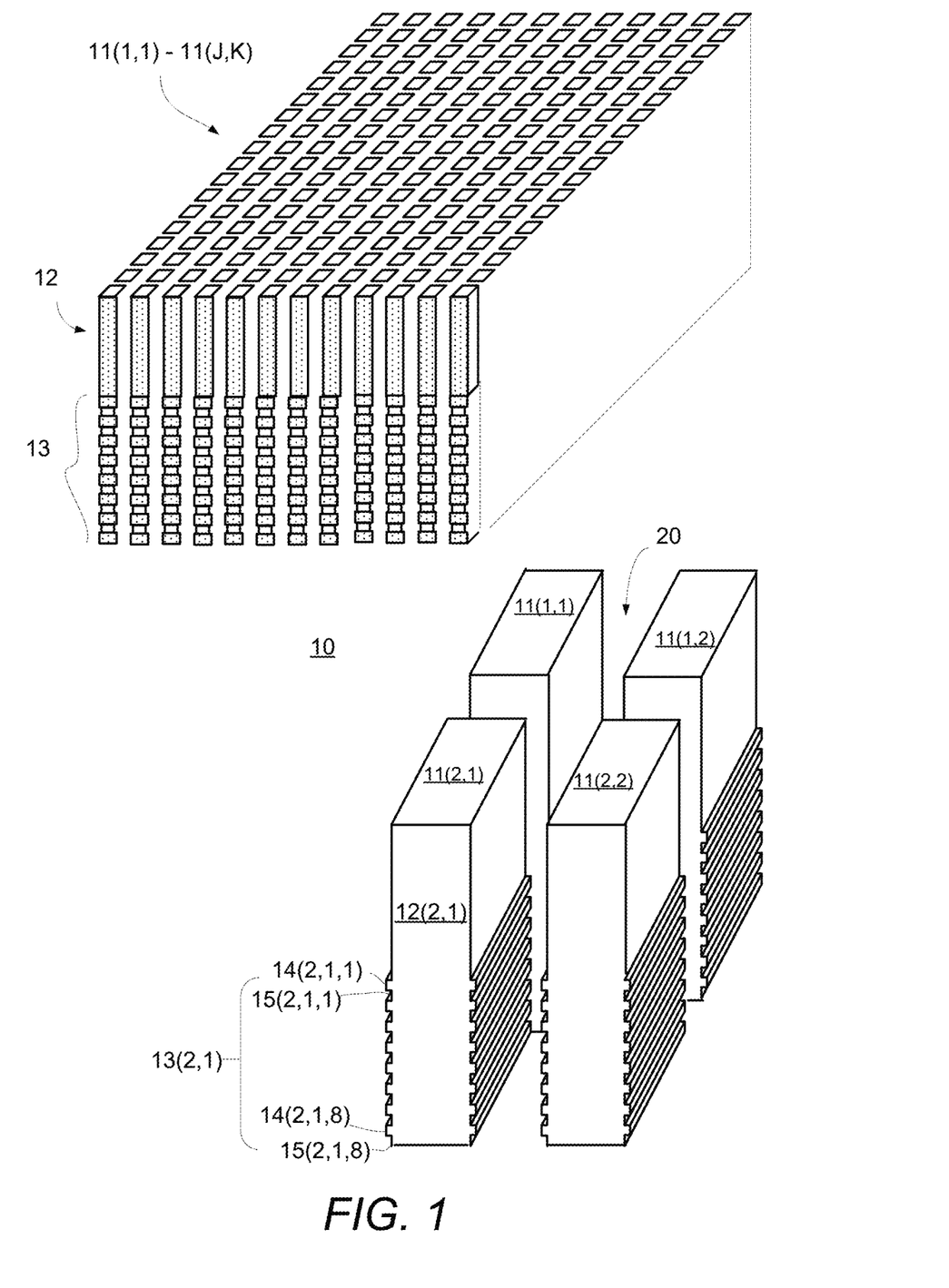
FIG. 1 illustrates an example of an intermediate product.

FIG. 1 illustrates an example of intermediate product 10. Intermediate product 10 is an outcome of manufacturing stage (c). Intermediate product 10 includes multiple spaced apart structural elements (denoted 11(1,1)-1(J,K)) that are arranged as a two dimensional grid of J rows and K columns. J and K being integers that exceed two. J and K usually well exceed two, and may exceed one thousand, ten thousand, one hundred thousand, and the like.

The structural elements are spaced apart from each other by open gaps 20. Each open gap (i) has a longitudinal axis, (ii) exhibits a high aspect ratio, (ii) has a width of nanometric scale, and (iv) is formed between structural elements of the intermediate product.

Each one of structural elements 11(1,1)-11(J,K) includes a sequence of layers. Each sequences of layers includes a top layer 12 that is followed by alternating nonconductive layers and recessed conductive layers. The alternating layers are collectively denoted 13. It should be noted that the structural elements may be arranged in any manner.

Figure 2:
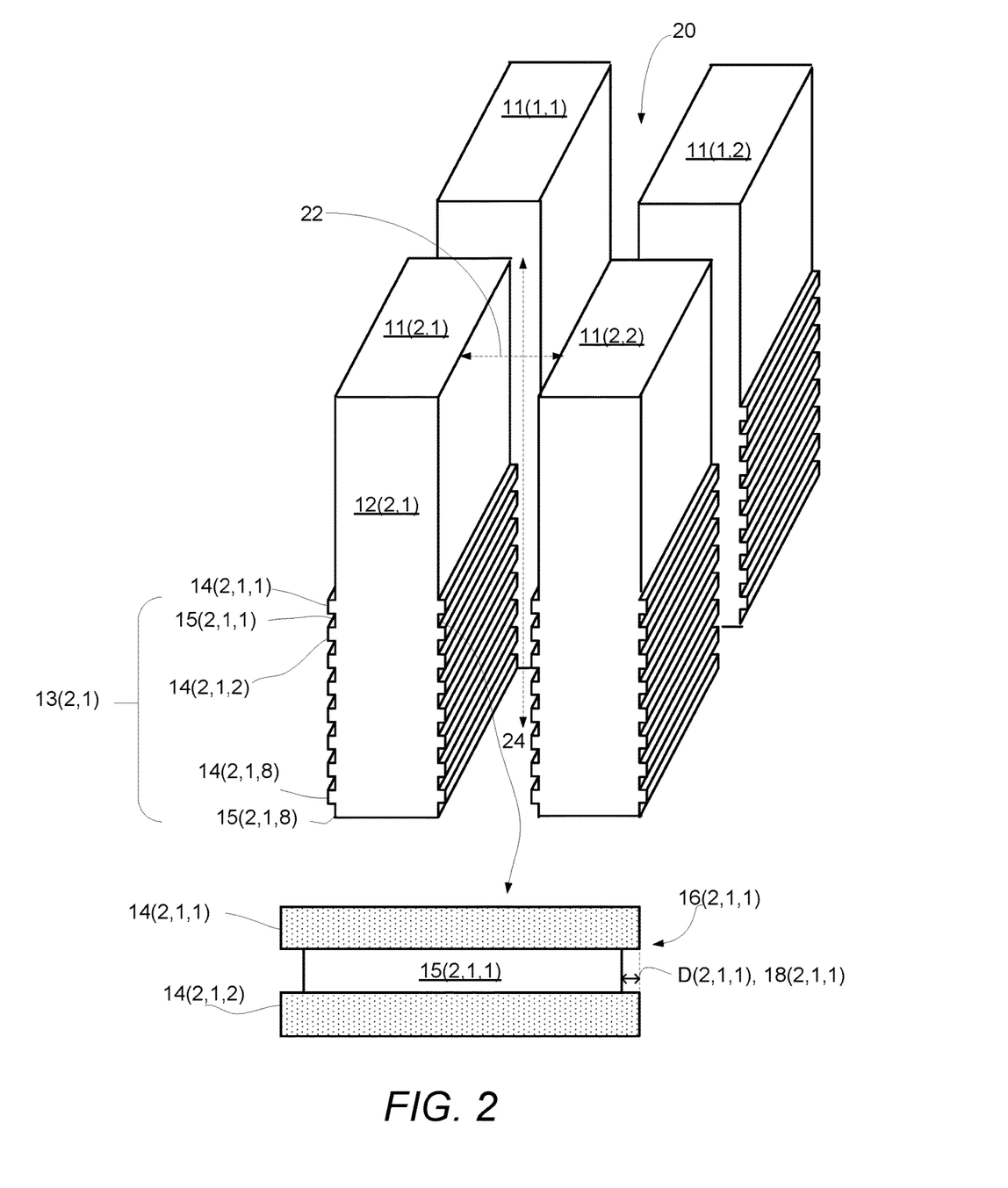
FIG. 2 illustrates an example of four structural elements.

FIG. 2 illustrates an example of four structural elements—first structural element 11(1,1), second structural element 11(1,2), third structural element 11(2,1) and fourth structural element 11(2,2). The four structural elements are proximate to each other.

FIG. 2 also illustrates that the width 22 of open gap 20. The width of the open gap may equal the distance between third structural element 11(2,1) and fourth structural element 11(2,2). The width 22 is of nanometric scale. The heights of each one of the structural elements well exceeds the width 22 of the open gap. The open gap 20 had an optical axis denoted 24.

Structural element (2,1) includes top layer 12(2,1) that is followed by alternating nonconductive layers and recessed conductive layers. The alternating layers are collectively denoted 13(2,1) and include (i) eight nonconductive layers such as first nonconductive layer 14(2,1,1), second nonconductive layer 14(2,1,2), and eighth nonconductive layer 14(2,1,8), and (iii) eight recessed conductive layers such as first recessed conductive layer 15(2,1,1), second recessed conductive layer 15(2,1,2), and eighth recess conductive layer 15(2,1,8).

FIG. 2 also illustrates an enlarged view of first nonconductive layer 14(2,1,1), first recessed conductive layer 15(2,1,1), and second nonconductive layer 14(2,1,2). First recess 16(2,1,1) is formed to the right of first recessed conductive layer 15(2,1,1), and another recess is formed to the left of the first recessed conductive layer 15(2,1,1). First recessed conductive layer 15(2,1,1) is the highest recessed conductive layer of the alternating layers and the first recess 16(2,1,1) may be regarded as the top recess of the alternating layers.

In some cases the electron image may include more accurate information regarding the top recess in relation to information related to lower recesses. In other cases the electron image may include information that is more accurate related to lower recesses.

The depth D(2,1,1) of the first recess is denoted 18(2,1,1) and may equal the distance between (i) the rightmost edge of first recessed conductive layer 15(2,1,1) and (ii) the rightmost edges of either one of the first nonconductive layer 14(2,1,1) and the second nonconductive layer 14(2,1,2).

The alternating layers of FIG. 2 define multiple recesses to the left of the recessed conductive layers and to the right of the recessed conductive layers. The evaluation of the intermediate product may be based, at least in part, on the depts of one or more the multiple recesses.

Figure 3:
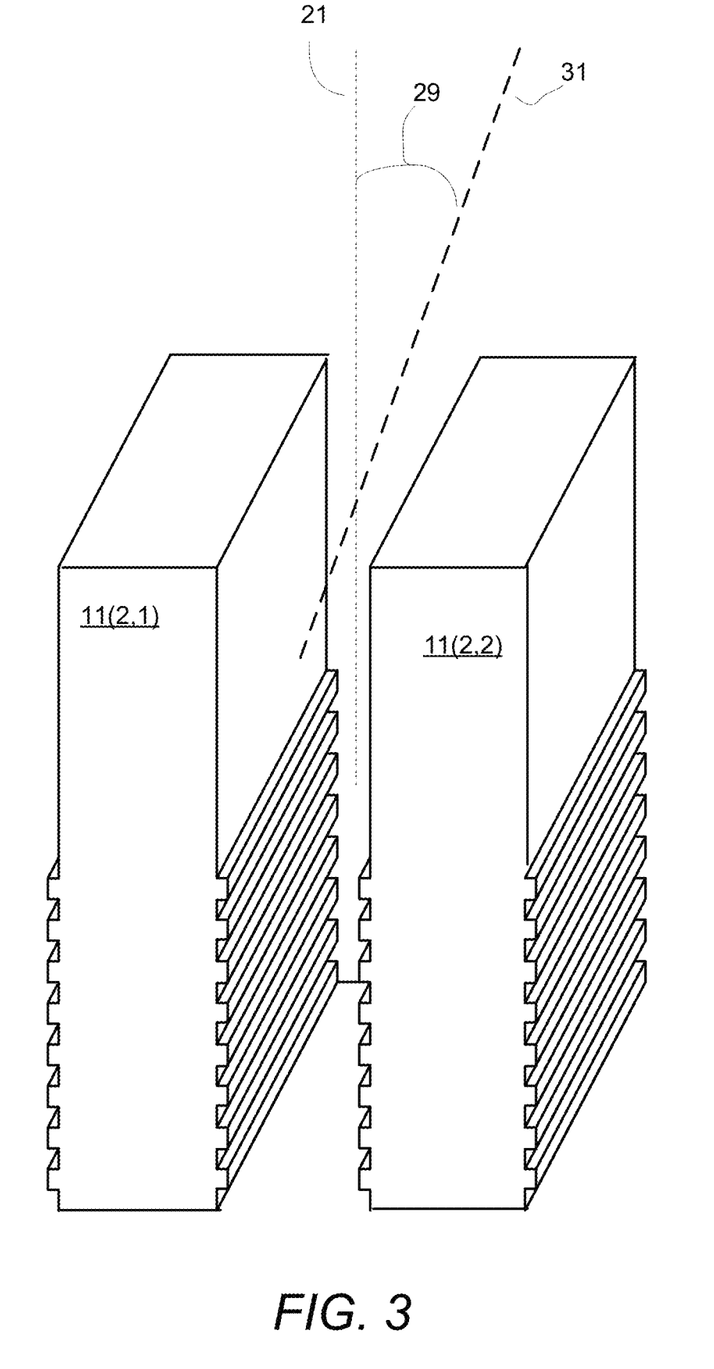
FIG. 3 illustrates an example of an electron beam that scans a portion of third structural element.

FIG. 3 illustrates an example of an electron beam 31 that scans a portion of third structural element 11(2,1). The electron beam 31 is oblique to longitudinal axis 21 of the open gap 20.

Figure 4:
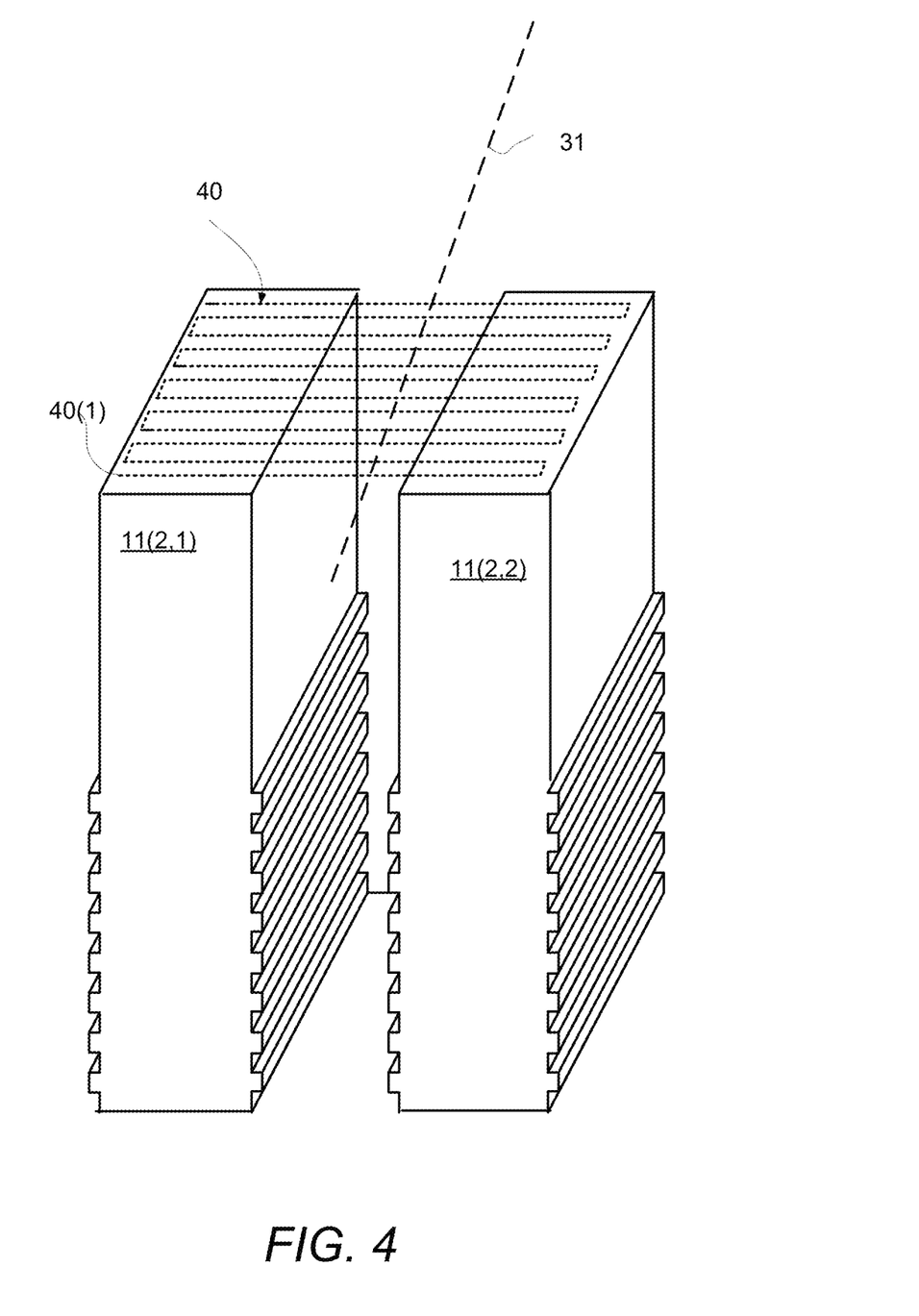
FIG. 4 illustrates an example of a scan pattern.

FIG. 4 illustrates an example of a scan pattern 40 followed by the electron beam 31 when scanning the portion of third structural element 11(2,1) and a portion of fourth structural element 11(2,2). The raster scan pattern includes multiple scan lines as well as counter scan lines. A first scan line is denoted 40(1). Other scan patterns may be used.

Figure 5:
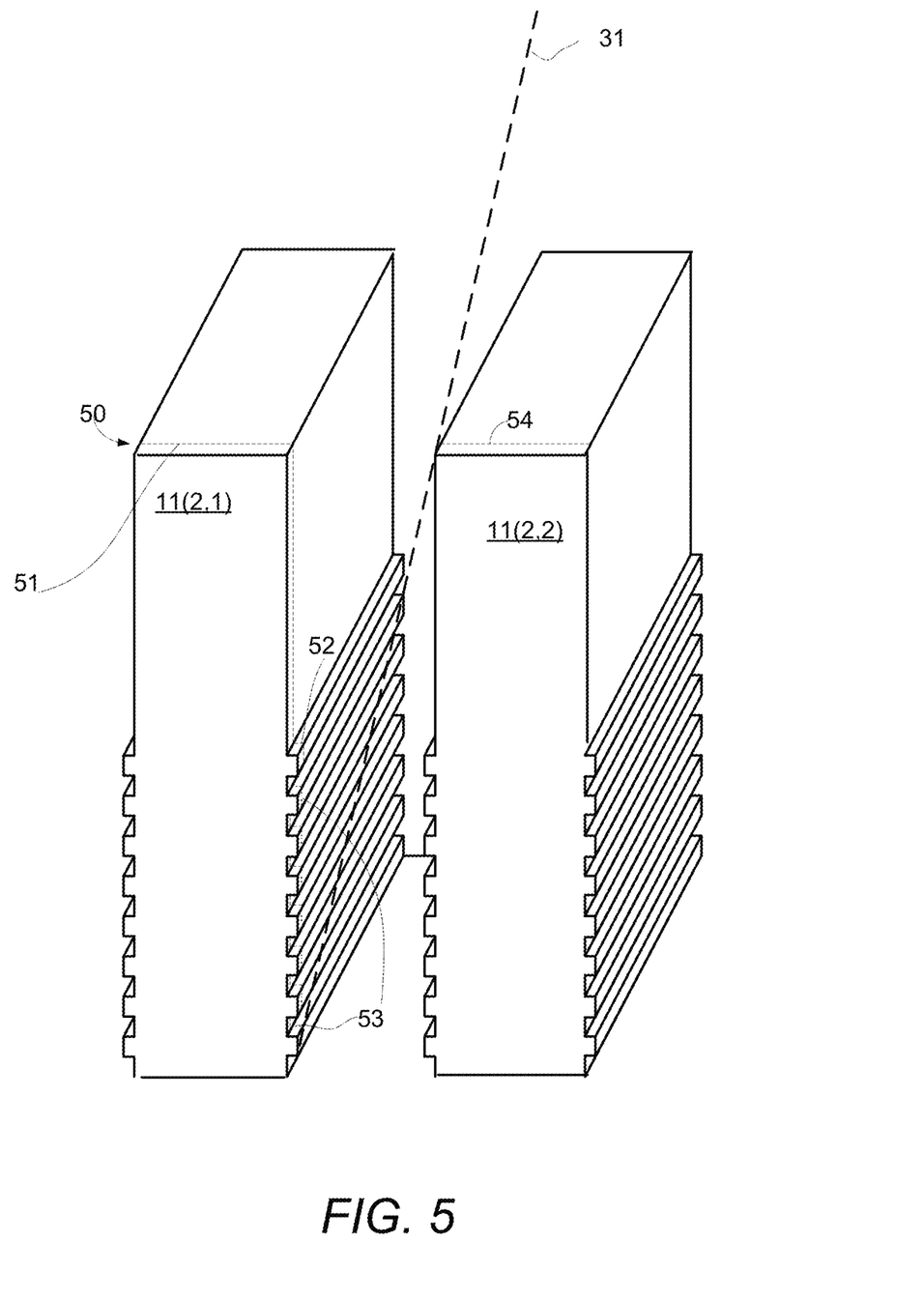
FIG. 5 illustrates an example of a path that is illuminated by an electron beam.

FIG. 5 illustrates an example of a path that is illuminated by electron beam 31 when the electron beam is scanned along first scan line 40(1). The path 50 includes:
 a. A first path segments 51 in which the electron beam scans the top layer of third structural element 11(2,1).
 b. A second path segments 52 in which the electron beam scans (at least) the first nonconductive layer of the alternating layers.
 c. A third path segment 53 in which the electron beam scans other nonconductive layers of the alternating layer (and may scan parts of the recessed conductive layers of the alternating layers.
 d. A fourth path segment 54 in which the electron beam scans the top layer of the fourth structural element 11(2,2).

Figure 6:
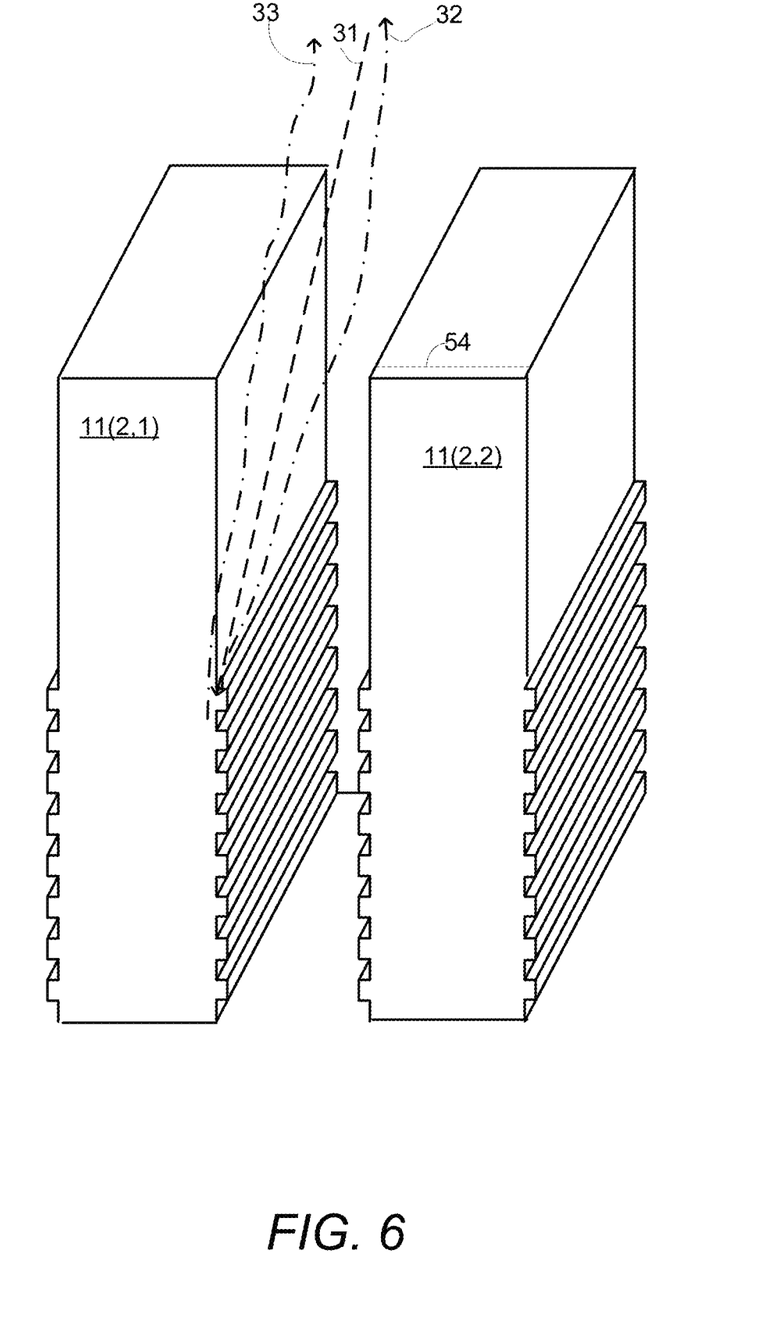
FIG. 6 illustrates an example of electron beam and electrons emitted from the structural element.

FIG. 6 illustrates an example of electron beam 31 and electrons 32 and 33 emitted from the structural element. The electrons may be emitted from a three dimensional region that is affected by the illumination. The electron beam may illuminate one layer of the alternating layers and electrons may be emitted from another layer of the alternating layers.

Figure 7:
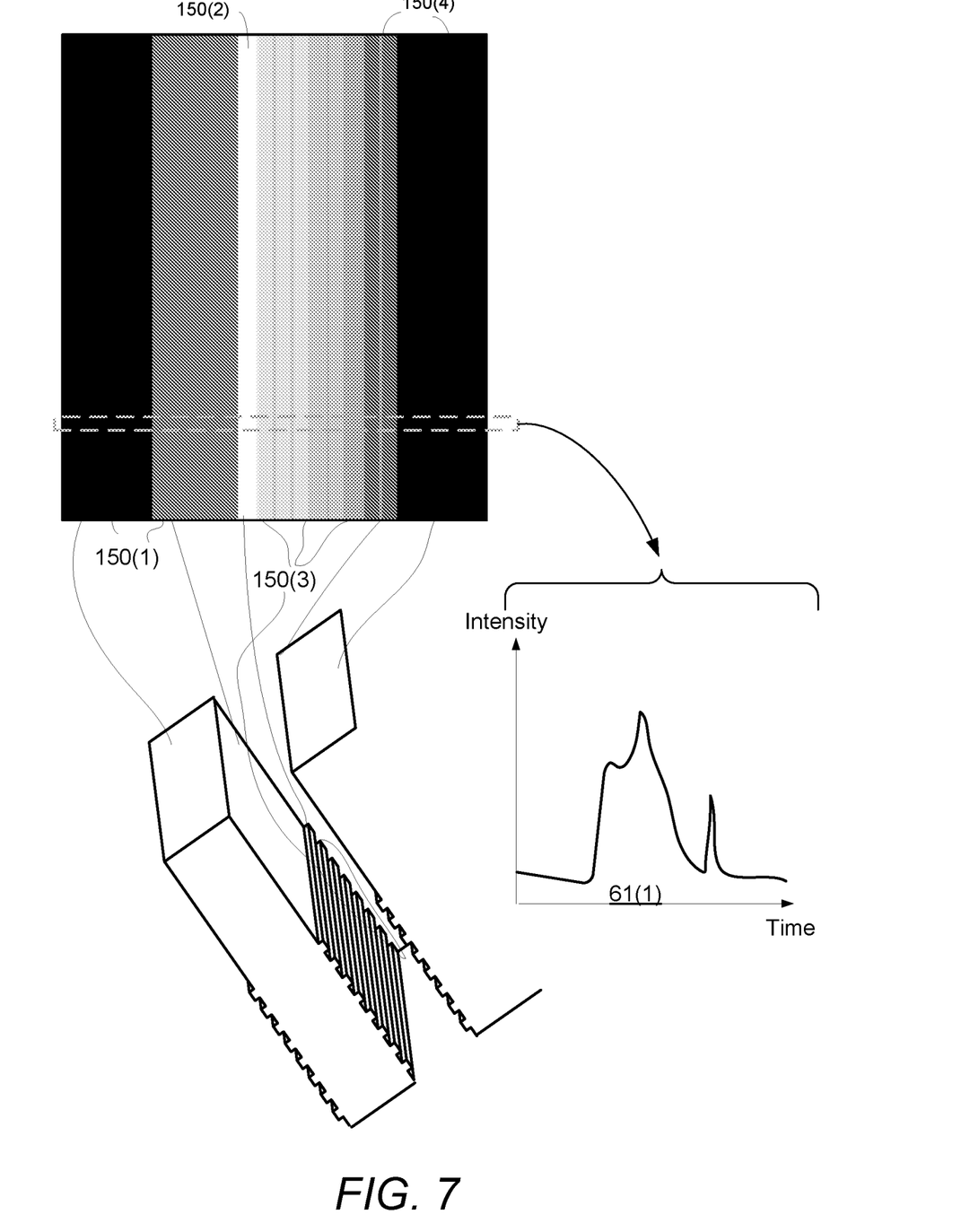
FIG. 7 illustrates an example of an electron image and of structural elements.

FIG. 7 illustrates an example of an electron image 150 and structural elements.

The electron image 150 includes pixels per each illuminated point of the first and second structural elements.

From left to right—top layer pixels 150(1) represent electrons emitted from the top layer of the left structural element, highest recessed conductive layer pixels 150(2) represent electrons emitted from the highest recess, additional recessed conductive layers electrons pixels 150(3) represent electrons emitted from the recesses that differ from the highest recess, and additional top layer pixels 150(4) represent electrons emitted from the top layer of the right structural element.

Figure 8:
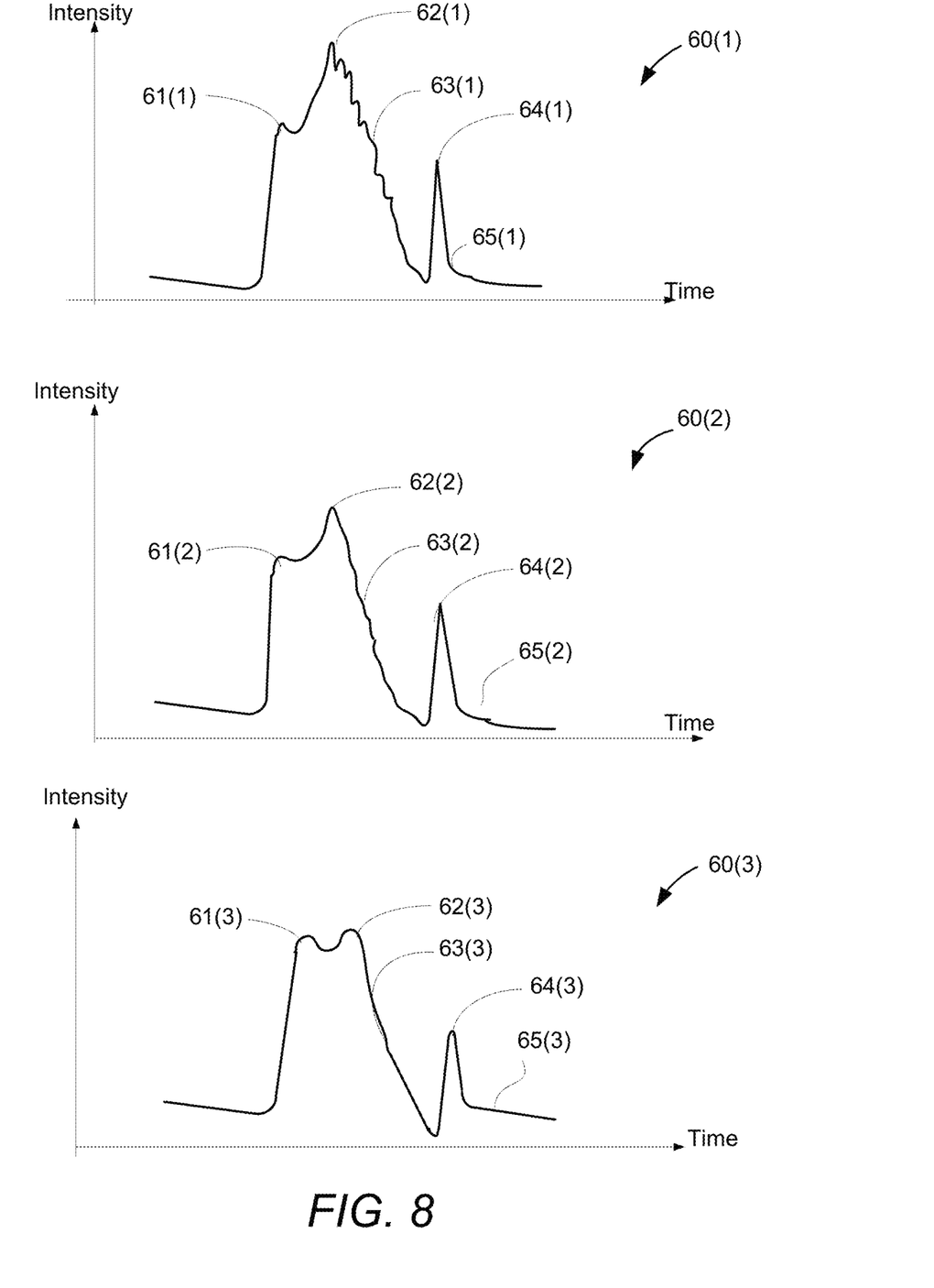
FIG. 8 illustrates examples of a relationship between gray levels and location along one or more scan line obtained from illuminating portions of three pairs of structural elements.

Pixels of a slice of the electron image are processed to provide intensity per location curves such as those illustrated in FIG. 8.

FIG. 8 illustrates examples of a relationship between gray levels and location along one or more scan line obtained from illuminating portions of three pairs of structural elements.

Due to signal to noise considerations it may be beneficial to generate a curve per multiple scan lines—for example by averaging the detection signals obtained from multiple scans of the electron beam.

The structural elements of each pair differ by structural elements of another pair by the depth of recesses of the recessed conductive layers.

FIG. 8 includes three curve—one curve per each pair of structural elements. Curve 60(1) includes:
 a. A second highest peak 61(1) that represents irradiation emitted as a result of illuminating a top layer of a first structural element of a first pair of structural elements.
 b. A first highest peak 62(1) that represents irradiation emitted as a result of illuminating a first nonconductive layer of a first structural element of the first pair of structural elements.
 c. A rough sloped area 63(1) that represents irradiation emitted as a result of illuminating at least other nonconductive layers of the first structural element of the first pair of structural elements.
 d. A third peak 61(1) that represents irradiation emitted as a result of illuminating a top layer of a second structural element of a first pair of structural elements.

Curves 60(2) and 60(3) have same parts (61(2), 62(2), 63(2), 64(2), 61(3), 62(3), 63(3) and 64(3))—but differ from curve 60(1) by at least one out of a difference between first and second highest peaks, roughness of the rough sloped area, curvature and/or of slope of at least a part of the curve.

It has been found that for a given conductive recessed region material, shallower recesses emit stronger signals. This may be attributed to the higher emission yield of the recessed conductive layers and to the fact that shallower recesses are formed when edges of the recessed conductive layer are closer (in comparison to deeper recesses) to edge of the nonconductive layers proximate to the recessed conductive layer.

Regarding curves 60(1), 60(2) and 60(3)—stronger signals may be represented by more intense first higher peaks, higher ratios between the first highest peak and the second highest peak, increased roughness of the rough sloped area, and the like.

Figure 9:
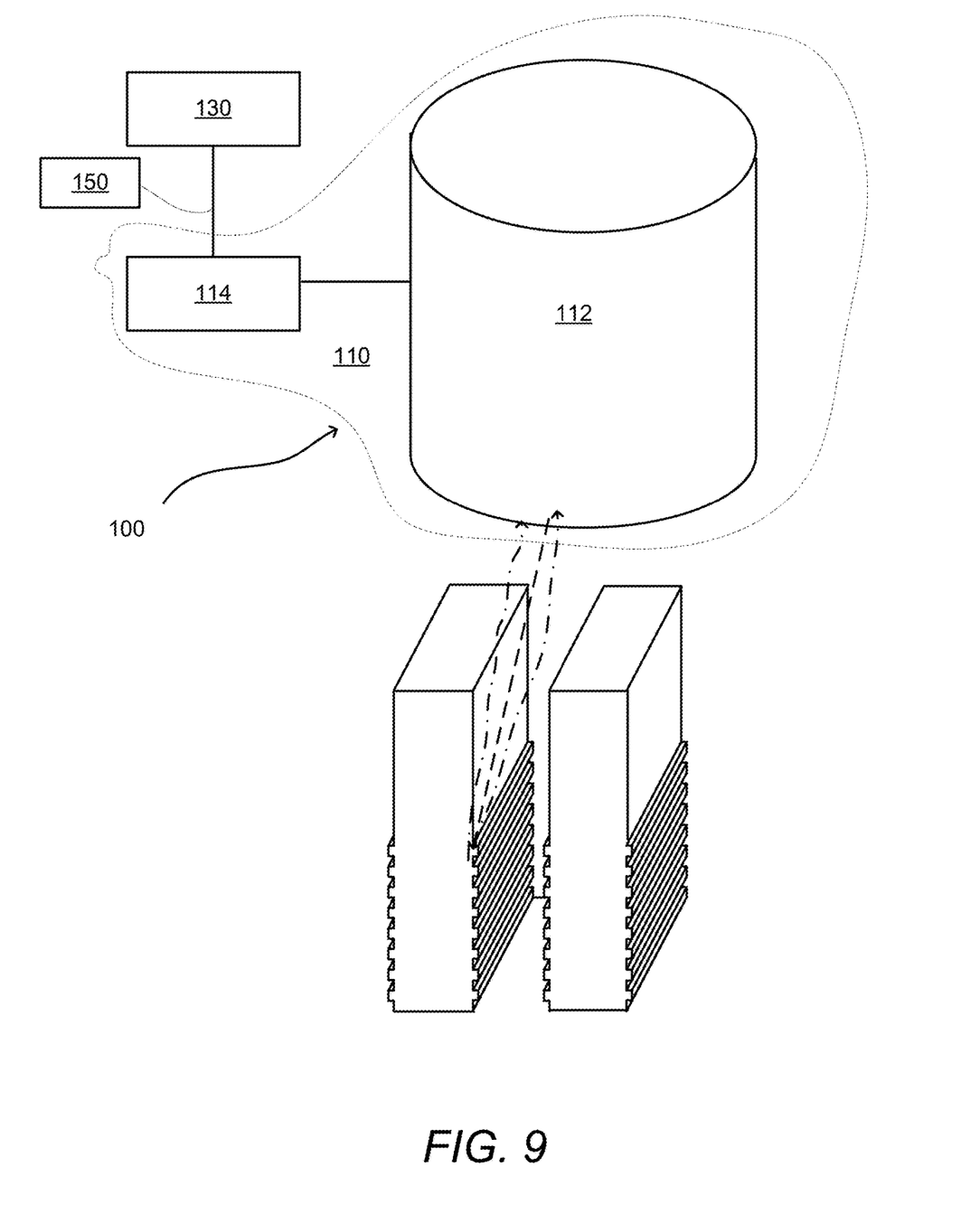
FIG. 9 illustrates an example of an evaluation system and of two structural elements.

FIG. 9 illustrates an example of evaluation system 100 and of two structural elements. Evaluation system 100 may include imager 110 and processing circuit 120. The imager 110 may be configured to obtain, via an open gap, an electron image (150) of a portion of a structural element that belongs to an intermediate product. Examples of structural elements are provided in FIGS. 1-2.

Imager 110 may include electron optics 112 configured to scan the portion of the structural element with an electron beam that is oblique to a longitudinal axis of the open gap.

Imager 110 may also include a frame grabber 114 or other circuitry that may convert detections signals to electron images in any manner. Processing circuit 130 is configured to evaluate the intermediate product based on the electron image.

Figure 10:
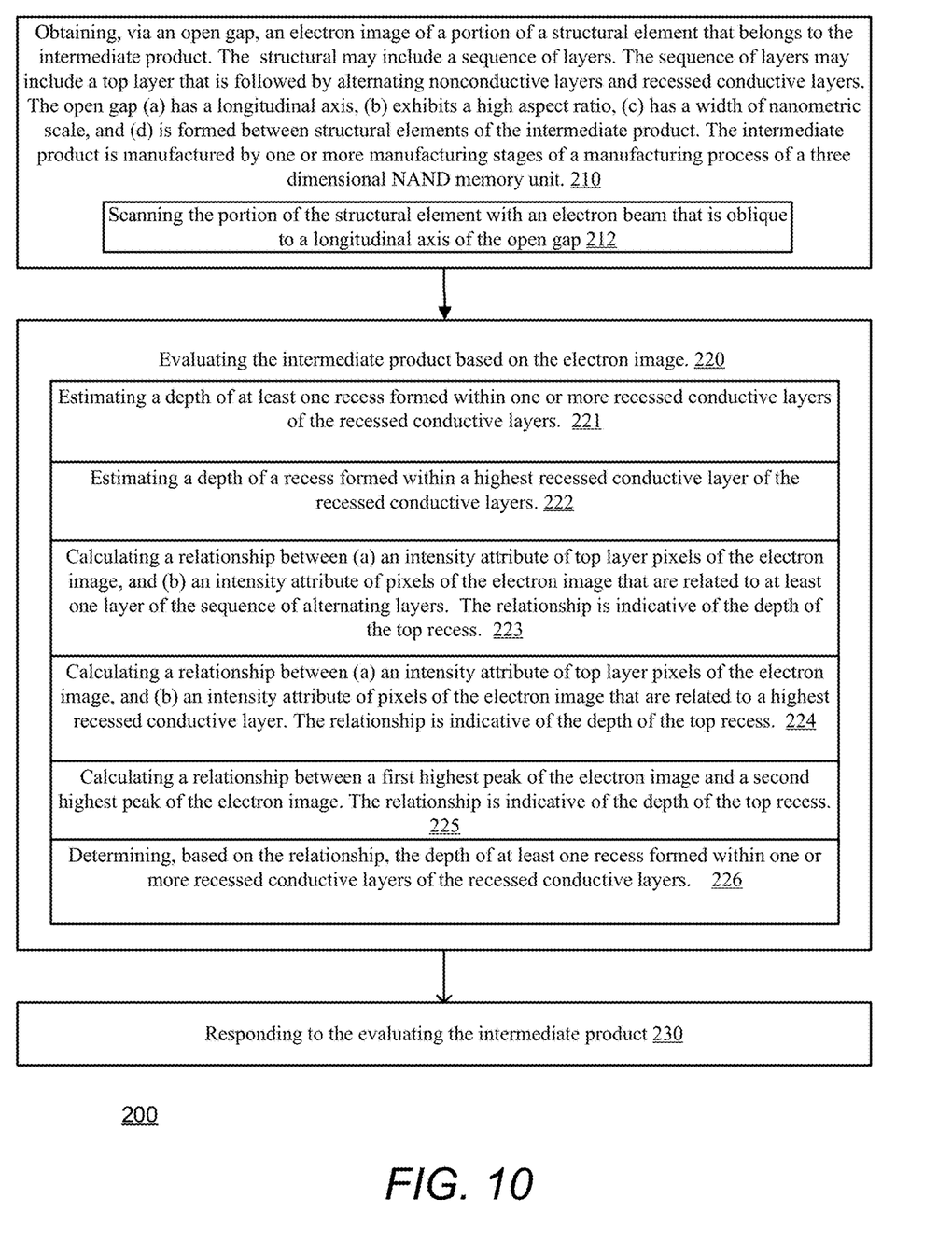
FIG. 10 illustrates an example of a method.

FIG. 10 illustrates an example of method 200. Method 200 may be executed by evaluation system 100. Method 200 may include measuring or estimating a depth of one or more recesses formed in one or more recessed conductive layers. The depth of a recess may equal a distance between an edge of an exposed part of a recessed conductive layer and an edge of an adjacent nonconductive layer. The recesses are formed within a high aspect hole and are concealed (by the exposed parts of the nonconductive) from normal illumination.

Accordingly, the depth of the recesses should be measured using a tilted illumination. The illumination is tilted in the sense that an impinging electron beam is not parallel and not normal to the longitudinal axis of the hole.

Method 200 may include steps 210, 220 and may also include step 230. Method 200 may start by step 210 of obtaining, via an open gap, an electron image of a portion of a structural element that belongs to the intermediate product. The structural may include a sequence of layers. The sequence of layers may include a top layer that is followed by alternating nonconductive layers and recessed conductive layers.

The open gap has a longitudinal axis, exhibits a high aspect ratio, has a width of nanometric scale, and is formed between structural elements of the intermediate product. The intermediate product is manufactured by one or more manufacturing stages of a manufacturing process of a three dimensional NAND memory unit.

Step 210 may include step 212 of scanning the portion of the structural element with an electron beam that is oblique to a longitudinal axis of the open gap. Step 210 may be followed by step 220 of evaluating the intermediate product based on the electron image.

Step 220 may include at least one of the following steps:
a. Step 221 of estimating a depth of at least one recess formed within one or more recessed conductive layers of the recessed conductive layers.
b. Step 222 of estimating a depth of a recess formed within a highest recessed conductive layer of the recessed conductive layers.
c. Step 223 calculating a relationship between (a) an intensity attribute of top layer pixels of the electron image, and (b) an intensity attribute of pixels of the electron image that are related to at least one layer of the sequence of alternating layers. The relationship is indicative of the depth of the top recess.
d. Step 224 of calculating a relationship between (a) an intensity attribute of top layer pixels of the electron image, and (b) an intensity attribute of pixels of the electron image that are related to a highest recessed conductive layer. The relationship is indicative of the depth of the top recess.
e. Step 225 of calculating a relationship between a first highest peak of the electron image and a second highest peak of the electron image. The relationship is indicative of the depth of the top recess.
f. Step 226 of determining, based on the relationship, the depth of at least one recess formed within one or more recessed conductive layers of the recessed conductive layers.

Step 220 may include finding peaks and validating the peaks. A peak may be defined as a significant maximum thereby preventing local noise related peaks detection. The peak may be detected and verified in various manner—for example by waveform smoothing, definition of a peak as a maximum inside of window, and filtering local peaks based on the minimal distance between nearest possible peak parameter.

Any of the mentioned above relationships may be learnt in any manner. For example—reference structural elements with recesses of known dimensions may be illuminated to provide measurements results that are associated with the known dimensions of the recesses. Additionally or alternatively—the relationship may be learnt from simulating the electron images obtained when scanning the structural elements.

The relationships may be measured on conductive layers and non-conductive layers of certain materials and then estimated for conductive layers and non-conductive layers made of other materials.

The relationships may be based on a difference between the emission yields of the conductive layers and non-conductive layers—and may be applied mutatis mutandis to other conductive layers and non-conductive layers having similar emission yield difference—or having different similar emission yield difference.

Step 220 may include classifying the recess to multiple classes based on the depth of the recesses. Each class may be related to a certain attributes of an electron image. The classification may take into account at least some out of a local curvature at the peak location, a second derivative of signal at the peak location, a local slope—the slope of signal in the peak vicinity.

Step 220 may be followed by step 230 of responding to the evaluating the intermediate product. Step 230 may include evaluating at least one of manufacturing stages (a), (b) and (c).

In the foregoing specification, the embodiments of the disclosure has been described with reference to specific examples of embodiments of the disclosure. It will, however, be evident that various modifications and changes may be made therein without departing from the broader spirit and scope of the embodiments of the disclosure as set forth in the appended claims.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the disclosure described herein are, for example, capable of operation in other orientations than those illustrated or otherwise described herein.

The connections as discussed herein may be any type of connection suitable to transfer signals from or to the respective nodes, units or devices, for example via intermediate devices. Accordingly, unless implied or stated otherwise, the connections may for example be direct connections or indirect connections. The connections may be illustrated or described in reference to be a single connection, a plurality of connections, unidirectional connections, or bidirectional connections. However, different embodiments may vary the implementation of the connections. For example, separate unidirectional connections may be used rather than bidirectional connections and vice versa. Also, plurality of connections may be replaced with a single connection that transfers multiple signals serially or in a time multiplexed manner. Likewise, single connections carrying multiple signals may be separated out into various different connections carrying subsets of these signals. Therefore, many options exist for transferring signals.

Any arrangement of components to achieve the same functionality is effectively "associated" such that the desired functionality is achieved. Hence, any two components herein combined to achieve a particular functionality may be seen as "associated with" each other such that the desired functionality is achieved, irrespective of architectures or intermedial components. Likewise, any two components so associated can also be viewed as being "operably connected," or "operably coupled," to each other to achieve the desired functionality.

Furthermore, those skilled in the art will recognize that boundaries between the above described operations merely illustrative. The multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments.

Also for example, in one embodiment, the illustrated examples may be implemented as circuitry located on a single integrated circuit or within a same device. Alternatively, the examples may be implemented as any number of separate integrated circuits or separate devices interconnected with each other in a suitable manner.

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to embodiments of the disclosure s containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

While certain features of the embodiments of the disclosure have been illustrated and described herein, many modifications, substitutions, changes, and equivalents will now occur to those of ordinary skill in the art. It is, therefore, to be understood that the appended claims are intended to cover all such modifications and changes as fall within the true spirit of the embodiments of the disclosure.

What is claimed is:

1. An evaluation system, comprising:
   an imager configured to obtain, via an open gap, an electron image of a portion of a structural element that belongs to an intermediate product manufactured by one or more manufacturing stages of a manufacturing process of a three dimensional NAND memory unit, the structural element comprising a sequence of layers including a top layer followed by alternating nonconductive layers and recessed conductive layers, wherein the imager comprises electron optics configured to scan the portion of the structural element with an electron beam that is oblique to a longitudinal axis of the open gap; and
   a processing circuit configured to evaluate the intermediate product based on the electron image;
   wherein the open gap (a) exhibits a high aspect ratio, (b) has a width of nanometric scale, and (c) is formed between structural elements of the intermediate product.

2. The evaluation system according to claim 1 wherein the processing circuit is configured to evaluate the intermediate product by estimating a depth of at least one recess formed within one or more recessed conductive layers of the recessed conductive layers.

3. The evaluation system according to claim 1 wherein the processing circuit is configured to evaluate the intermediate product by estimating a depth of a recess formed within a highest recessed conductive layer of the recessed conductive layers.

4. The evaluation system according to claim 1 wherein the processing circuit is configured to evaluate the intermediate product by calculating a relationship between (a) an intensity attribute of top layer pixels of the electron image, and (b) an intensity attribute of pixels of the electron image that are related to at least one layer of the sequence of alternating layers.

5. The evaluation system according to claim 1 wherein the processing circuit is configured to evaluate the intermediate product by calculating a relationship between (a) an intensity attribute of top layer pixels of the electron image, and (b) an intensity attribute of pixels of the electron image that are related to a highest recessed conductive layer.

6. The evaluation system according to claim 1 wherein the processing circuit is configured to evaluate the intermediate product by calculating a relationship between a first highest peak of the electron image and a second highest peak of the electron image.

7. The evaluation system according to claim 1 wherein the processing circuit is configured to evaluate the intermediate product by calculating a roughness of a curve that represents intensities of electron image pixels located along a scan line that travels over at least two layers of the alternating nonconductive layers and recessed conductive layers.

8. The evaluation system according to claim 1 wherein the processing circuit is configured to evaluate the intermediate product by calculating a roughness of a curve that represents intensities of electron image pixels located along a scan line that travels over at least two layers of the alternating nonconductive layers and recessed conductive layers.

9. A non-transitory computer readable medium comprising computer-readable instructions that, once executed by a computerized evaluation system causes the computerized evaluation system to execute a process that comprises:
   obtaining, via an open gap, an electron image of a portion of a structural element that belongs to an intermediate product; wherein the structural element comprises a sequence of layers, wherein the sequence of layers comprises a top layer that is followed by alternating nonconductive layers and recessed conductive layers; and
   evaluating the intermediate product based on the electron image;

wherein the open gap (a) has a longitudinal axis, (b) exhibits a high aspect ratio, (c) has a width of nanometric scale, and (d) is formed between structural elements of the intermediate product, wherein the intermediate product is manufactured by one or more manufacturing stages of a manufacturing process of a three dimensional NAND memory unit; and wherein the obtaining of the electron image comprises scanning the portion of the structural element with an electron beam that is oblique to a longitudinal axis of the open gap.

10. A method for evaluating an intermediate product, the method comprising:

obtaining, via an open gap, an electron image of a portion of a structural element that belongs to the intermediate product; wherein the structural element comprises a sequence of layers, wherein the sequence of layers comprises a top layer that is followed by alternating nonconductive layers and recessed conductive layers; and evaluating the intermediate product based on the electron image;

wherein the open gap (a) has a longitudinal axis, (b) exhibits a high aspect ratio, (c) has a width of nanometric scale, and (d) is formed between structural elements of the intermediate product, wherein the intermediate product is manufactured by one or more manufacturing stages of a manufacturing process of a three dimensional NAND memory unit; and wherein the obtaining of the electron image comprises scanning the portion of the structural element with an electron beam that is oblique to a longitudinal axis of the open gap.

11. The method according to claim 10 wherein the evaluating comprises estimating a depth of at least one recess formed within one or more recessed conductive layers of the recessed conductive layers.

12. The method according to claim 10 wherein the evaluating comprises estimating a depth of a recess formed within a highest recessed conductive layer of the recessed conductive layers.

13. The method according to claim 10 wherein the evaluating comprises calculating a relationship between (a) an intensity attribute of top layer pixels of the electron image, and (b) an intensity attribute of pixels of the electron image that are related to at least one layer of the sequence of alternating layers.

14. The method according to claim 10 wherein the evaluating comprises calculating a relationship between (a) an intensity attribute of top layer pixels of the electron image, and (b) an intensity attribute of pixels of the electron image that are related to a highest recessed conductive layer.

15. The method according to claim 10 wherein the evaluating comprises calculating a relationship between a first highest peak of the electron image and a second highest peak of the electron image.

* * * * *

UNITED STATES PATENT AND TRADEMARK OFFICE
CERTIFICATE OF CORRECTION

| | |
|---|---|
| PATENT NO. | : 11,476,081 B2 |
| APPLICATION NO. | : 16/917304 |
| DATED | : October 18, 2022 |
| INVENTOR(S) | : Kris et al. |

It is certified that error appears in the above-identified patent and that said Letters Patent is hereby corrected as shown below:

In the Specification

Column 1, Line 14, please add the following new heading and paragraph before the heading BACKGROUND:
--STATEMENT AS TO RIGHTS TO INVENTIONS MADE UNDER FEDERALLY SPONSORED RESEARCH AND DEVELOPMENT
The project leading to this application has received funding from the ECSEL Joint Undertaking (JU) under grant agreement No. 783247 (TAPES3). The JU receives support from the European Union's Horizon 2020 research and innovation programme and Italy, Germany, Belgium, Sweden, Austria, Romania, Slovakia, France, Poland, Spain, Ireland, Switzerland, Israel.--

Signed and Sealed this
Twenty-first Day of November, 2023

Katherine Kelly Vidal
*Director of the United States Patent and Trademark Office*